United States Patent
Yan et al.

(10) Patent No.: US 7,611,929 B2
(45) Date of Patent: Nov. 3, 2009

(54) METHOD FOR FABRICATING TFT ARRAY SUBSTRATE

(75) Inventors: Tzu-Min Yan, Miao-Li (TW); Chien-Ting Lai, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 298 days.

(21) Appl. No.: 11/642,042

(22) Filed: Dec. 18, 2006

(65) Prior Publication Data

US 2007/0138472 A1 Jun. 21, 2007

(30) Foreign Application Priority Data

Dec. 16, 2005 (TW) ............................. 94144818 A

(51) Int. Cl.
*H01L 21/00* (2006.01)

(52) U.S. Cl. .............................. 438/149; 257/E21.094; 257/E21.104; 257/E21.121; 257/E21.372

(58) Field of Classification Search ............... 438/149; 257/E21.094, E21.104, E21.121, E21.372
See application file for complete search history.

(56) References Cited

U.S. PATENT DOCUMENTS

| 5,926,702 | A | 7/1999 | Kwon et al. | |
| 6,960,484 | B2 * | 11/2005 | Yoo et al. | 438/30 |
| 7,468,527 | B2 * | 12/2008 | Ahn | 257/72 |

* cited by examiner

*Primary Examiner*—Quoc D Hoang
(74) *Attorney, Agent, or Firm*—Wei Te Chung

(57) ABSTRACT

An exemplary method for fabricating a thin film transistor (TFT) array substrate includes: providing an insulating substrate; forming a plurality of gate electrodes and a plurality of reflective patterns on the insulating substrate using a first photo-mask process; forming a gate insulating layer, an amorphous silicon layer, a doped amorphous silicon layer, and a source/drain metal layer on the insulating substrate having the gate electrodes and the reflective patterns; forming a plurality of source electrodes and a plurality of drain electrodes on the doped amorphous silicon layer; depositing a passivation layer on the source electrodes, the drain electrodes and the gate insulating layer; and forming a pixel electrode on the passivation layer.

8 Claims, 6 Drawing Sheets

METHOD FOR FABRICATING TFT ARRAY SUBSTRATE

FIELD OF THE INVENTION

The present invention relates to methods of fabricating thin film transistor (TFT) array substrates used in liquid crystal displays (LCDs).

GENERAL BACKGROUND

A typical liquid crystal display (LCD) is capable of displaying a clear and sharp image through thousands or even millions of pixels that make up the complete image. The liquid crystal display has thus been applied to various electronic equipment in which messages or pictures need to be displayed, such as mobile phones and notebook computers. A liquid crystal panel is a major component of the LCD. The liquid crystal panel generally includes a thin film transistor (TFT) array substrate, a color filter substrate opposite to the TFT array substrate, and a liquid crystal layer sandwiched between the two substrates.

Referring to FIG. 16, part of a typical TFT array substrate is shown. The TFT array substrate 100 includes a plurality of parallel gate lines 110, and a plurality of parallel data lines 120 perpendicular to the plurality of gate lines 110. The plurality of gate lines 110 and data lines 120 cross each other to define a plurality of pixel units. Each pixel unit has a thin film transistor (TFT) 130, a pixel electrode 140, and a storage capacitance electrode line 150. The TFT 130 is disposed at an intersection of a corresponding one of the gate lines 110 and a corresponding one of the data lines 120. The TFT 130 has a gate electrode 131 connected to the gate line 110, a source electrode 132 connected to the data line 120, and a drain electrode 133 connected to the pixel electrode 140. The storage capacitance electrode line 150 is parallel to the gate lines 110, and forms a storage capacitance with the pixel electrode 140.

Referring also to FIG. 17, the TFT array substrate 100 further includes: a substrate 101, the gate lines 110 and the storage capacitance electrode line 150 being formed on the substrate 101; a gate insulating layer 102 formed on the substrate 101 having the gate lines 110 and the storage capacitance electrode line 150; a semiconductor layer 103 formed on the gate insulating layer 102, the source electrode 132 and the drain electrode 133 being formed on the gate insulating layer 102 and the semiconductor layer 103; and a passivation layer 104 formed on the gate insulating layer 102, the source electrode 132 and the drain electrode 133. The pixel electrode 140 is formed on the passivation layer 104, and electrically connects with the drain electrode 133 through a through hole 105 defined in the passivation layer 104.

The pixel electrode 140 is made from Indium Tin Oxide (ITO). The gate lines 110 electrically connect with an external driving circuit. The gate lines 110 and the storage electrode lines 150 are made from molybdenum (Mo), which can help avoid chemical reaction occurring between the gate lines 110 and the storage electrode lines 150.

A method of manufacturing the TFT substrate 100 includes the following steps (described in relation to a part of the TFT array substrate 100 only): forming a gate metal layer; forming a gate electrode; forming a gate insulating layer and an amorphous silicon (a-Si) and doped a-Si layer; forming a semiconductor layer on the gate insulating layer; forming a source/drain metal layer; forming source/drain electrodes; forming a passivation material layer; forming a passivation layer; forming a transparent conductive layer; and forming a pixel electrode. However, the method includes five photo-mask processes, each of which is rather complicated and costly. Thus, the method for fabricating the TFT array substrate 100 is correspondingly complicated and costly.

What is needed, therefore, is a method for fabricating a TFT array substrate that can overcome the above-described problems.

SUMMARY

An exemplary method for fabricating a thin film transistor (TFT) array substrate includes: providing an insulating substrate; forming a gate electrode and a reflective pattern on the insulating substrate using a first photo-mask process; forming a gate insulating layer, an amorphous silicon and doped amorphous silicon layer, and a source/drain metal layer on the insulating substrate having the gate electrode and the reflective pattern; forming a source electrode and a drain electrode on the amorphous silicon and doped amorphous silicon layer; depositing a passivation layer on the source electrode, the drain electrode and the gate insulating layer; and forming a pixel electrode on the passivation layer.

Other advantages and novel features will become more apparent from the following detailed description when taken in conjunction with the accompanying drawings.

BRIEF DESCRIPTION OF THE DRAWINGS

FIG. 1 is a side cross-sectional view relating to a step of providing a substrate and forming a first metal layer, and a second metal layer, and a first photo-resist layer on the substrate.

FIG. 2 is a side cross-sectional view relating to a first photo-mask process.

FIG. 3 is an isometric view of a photo mask used in the first photo-mask process of FIG. 2.

FIG. 4 is a side cross-sectional view relating to a step of forming a photo-resist layer having different heights.

FIG. 5 is a side cross-sectional view of the substrate after the first and second metal layers have been etched.

FIG. 6 is a side cross-sectional view of the substrate after the photo-resist layer having different heights has been etched.

FIG. 7 is a side cross-sectional view relating to a next step of forming a gate electrode and a reflective pattern.

FIG. 8 is a side cross-sectional view relating to a next step of forming a gate insulating layer, and an amorphous silicon (a-Si) and doped a-Si layer, on the substrate.

FIG. 9 is a side cross-sectional view relating to a next step of forming a semiconductor pattern.

FIG. 10 is a side cross-sectional view relating to a next step of forming a source/drain metal layer.

FIG. 11 is a side cross-sectional view relating to a next step of forming a source/drain pattern.

FIG. 12 is a side cross-sectional view relating to a next step of depositing a passivation layer.

FIG. 13 is a side cross-sectional view relating to a next step of forming a passivation pattern.

FIG. 14 is a side cross-sectional view relating to a next step of forming a transparent conductive layer.

FIG. 15 is a side cross-sectional view relating to a next step of forming a pixel electrode.

FIG. 16 is essentially a top plan view of a pixel unit of a conventional TFT array substrate.

FIG. 17 is a side cross-sectional view of part of the pixel unit of the TFT array substrate of FIG. 16, corresponding to line XVII-XVII thereof.

DETAILED DESCRIPTION OF PREFERRED EMBODIMENTS

A method for manufacturing a thin film transistor (TFT) array substrate according to an exemplary embodiment of the present invention includes the following processes. For the sake of simplicity, unless the context indicates otherwise, only formation of a part of the TFT array substrate as shown in FIGS. 1 through 15 is described.

Figure 1:
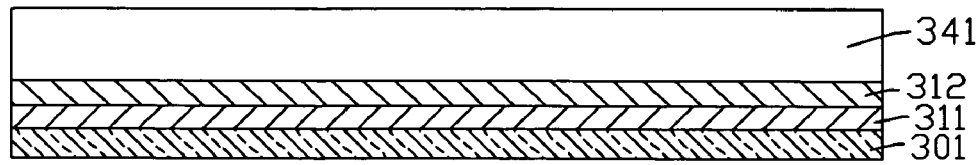
FIGS. 1 through 15 relate to a method for manufacturing a TFT array substrate according to an exemplary embodiment of the present invention.

In a first step, referring to FIG. 1, an insulating substrate 301 is provided. The substrate 301 may be made from glass or quartz. A first metal layer 311, a second metal layer 312, and a first photo-resist layer 341 are sequentially formed on the substrate 301. The first metal layer 311 may be made from material having high reflectivity, such as aluminum (Al) or an alloy of aluminum and neodymium (Nd). The second metal layer 312 may be made from material including any one or more items selected from the group consisting of molybdenum (Mo), chromium (Cr), and titanium (Ti).

Figure 2:
Figure 2:
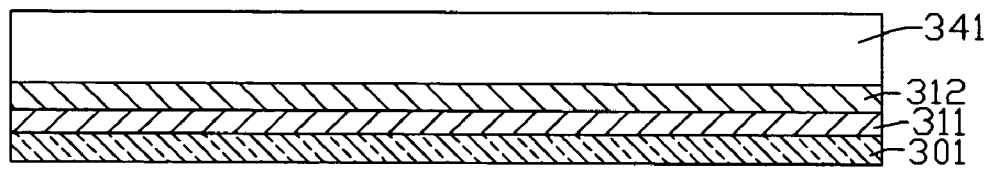
Figure 3:
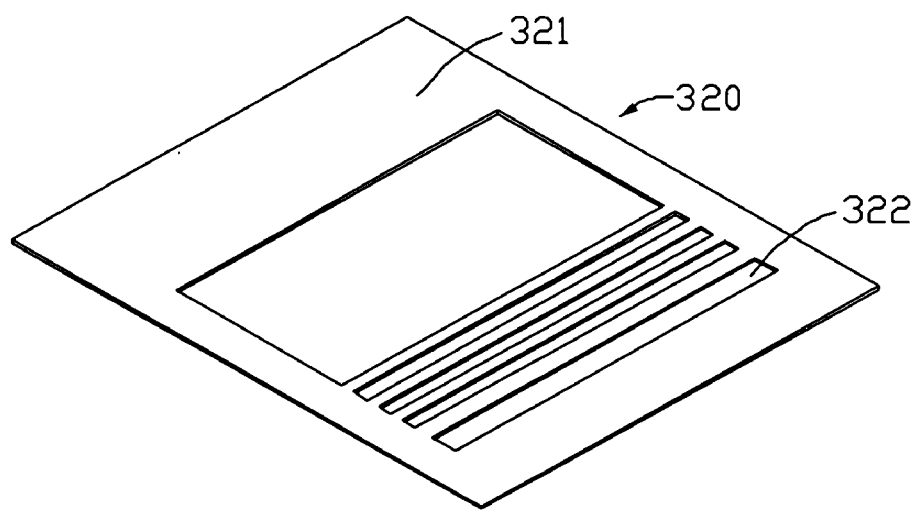
Figure 4:
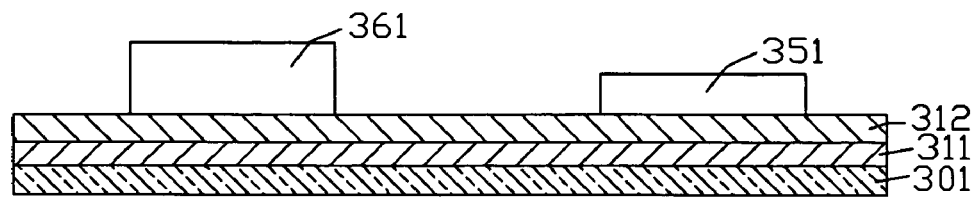
Figure 5:
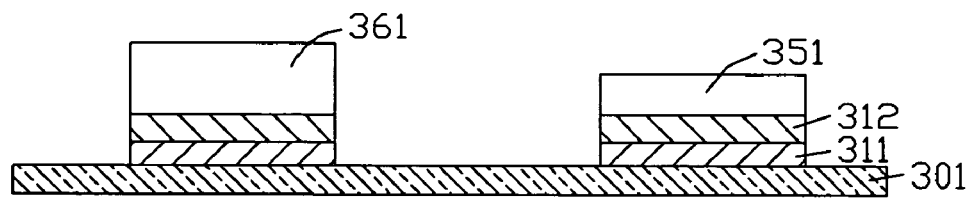
Figure 6:
Figure 7:
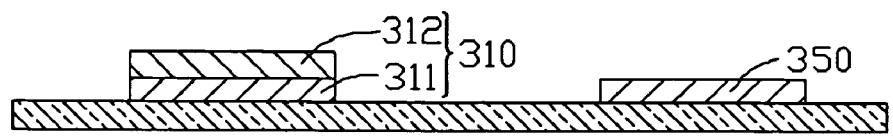

In a second step, referring to FIG. 2, a light source (not shown) and a first photo-mask 320 are used to expose the first photo-resist layer 341. The photo-mask 320 is a slit mask, which has a slit region 322 and a shielding region 321 (as shown in FIG. 3). The slit region 322 of the photo-mask 320 has a higher light transmittance ratio than the shielding region 321. Thus, light energy exiting from the slit region 322 is higher than that exiting from the shielding region 321. Then the exposed first photo-resist layer 341 is developed, thereby forming a first photo-resist sub-pattern 351 and a second photo-resist sub-pattern 361. The first photo-resist sub-pattern 351 corresponds to the slit region 322, and the second photo-resist sub-pattern 361 corresponds to the shielding region 321, as shown in FIG. 4. The first photo-resist sub-pattern 351 is thinner than the second photo-resist sub-pattern 361. Using the first photo-resist sub-pattern 351 as a mask, the second metal layer 312 and the first metal layer 311 are etched, thereby forming a first metal layer pattern and a second metal layer pattern, as shown in FIG. 5. After that, a second etching process is performed in order to etch the first photo-resist sub-pattern 351 and the second photo-resist sub-pattern 361. By controlling the etching time, the first photo-resist sub-pattern 351 is completely etched away, and the second photo-resist sub-pattern 361 has a reduced thickness (as shown in FIG. 6). In addition, using the residual second photo-resist sub-pattern 361 as a mask, the exposed second metal layer 312 (corresponding to where the first photo-resist sub-pattern 351 was) is etched a predetermined time. Thereby, a reflective pattern 350 corresponding to the first photo-resist sub-pattern 351 is formed, as shown in FIG. 7. The residual second photo-resist sub-pattern 361 is then removed by an acetone solution, thereby forming a gate electrode 310, as shown in FIG. 7. The substrate 301 is then cleaned and dried.

Figure 8:
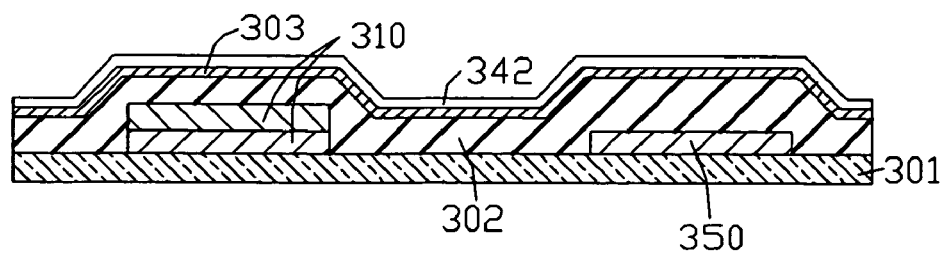

In a third step, referring to FIG. 8, a gate insulating layer 302 is formed on the substrate 301 having the gate electrode 310 and the reflective pattern 350 by a chemical vapor deposition (CVD) process. In this process, silane ($SiH_4$) reacts with alkaline air ($NH_4+$) to obtain silicon nitride ($SiN_x$), a material of the gate insulating layer 302. An amorphous silicon (a-Si) material layer is deposited on the gate insulating layer 302 by a CVD process. The a-Si layer is doped, thereby forming an a-Si and doped a-Si layer 303. A second photo-resist layer 342 is deposited on the a-Si and doped a-Si layer 303.

Figure 9:
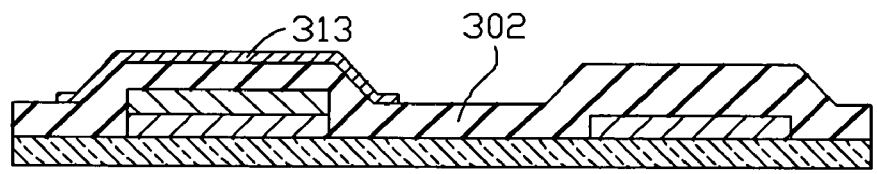

In a fourth step, referring to FIG. 9, a light source and a photo-mask (not shown) are used to expose the second photo-resist layer 342. Then the exposed second photo-resist layer 342 is developed, thereby forming a second photo-resist sub-pattern (not shown). Using the second photo-resist sub-pattern as a mask, the a-Si and doped a-Si layer 303 is etched, thereby fanning a semiconductor pattern 313.

Figure 10:
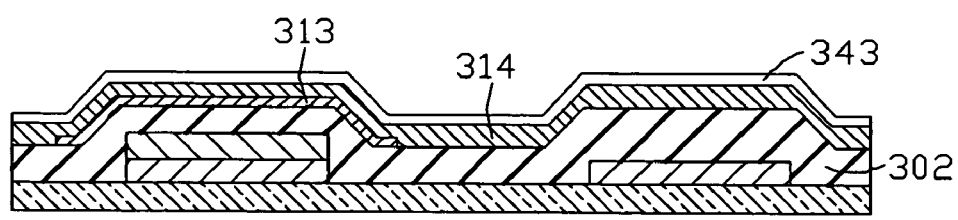
Figure 11:
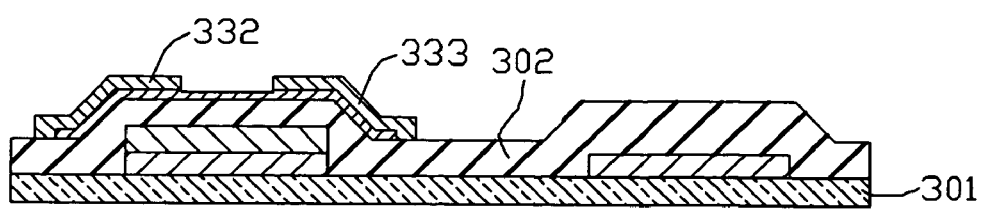

In a fifth step, referring to FIG. 10, a source/drain metal layer 314 and a third photo-resist layer 343 are sequentially formed on the semiconductor pattern 313 and the gate insulating layer 302. The source/drain metal layer 314 may be made from material including any one or more items selected from the group consisting of molybdenum alloy and molybdenum. The third photo-resist layer 343 is exposed by a third photo-mask, and then is developed, thereby forming a third photo-resist pattern (not shown). The source/drain metal layer 314 is etched according to the third photo-resist pattern, thereby forming a pattern of the source electrode 332 and the drain electrode 333. The third photo-resist layer is then removed by an acetone solution. Thereby, the layered and patterned substrate 301 as shown in FIG. 11 is attained.

Figure 12:
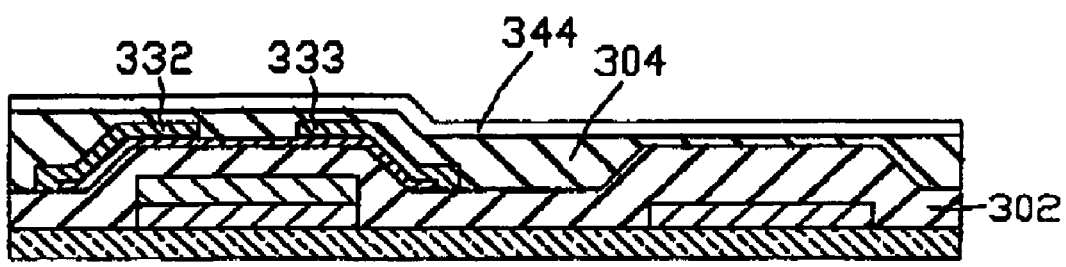
Figure 13:
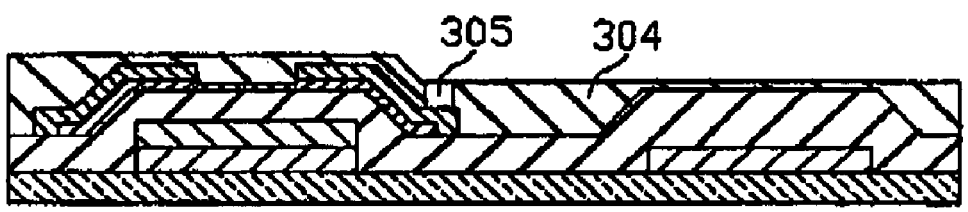

In a sixth step, referring to FIG. 12, a passivation layer 304 and a fourth photo-resist layer 344 are sequentially formed on the combination of the source electrode 332, the drain electrode 333, the semiconductor pattern 313, and the gate insulating layer 302. The fourth photo-resist layer 344 is exposed by a fourth photo-mask, and then is developed, thereby forming a fourth photo-resist pattern (not shown). The passivation layer 304 is etched according to the fourth photo-resist pattern, thereby forming a connecting hole 305 in the passivation layer 304. The fourth photo-resist pattern is then removed by an acetone solution. Thereby, the layered and patterned substrate 301 as shown in FIG. 13 is attained.

Figure 14:
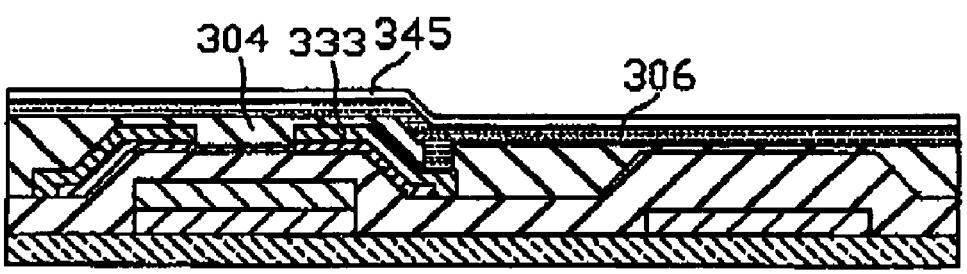
Figure 15:
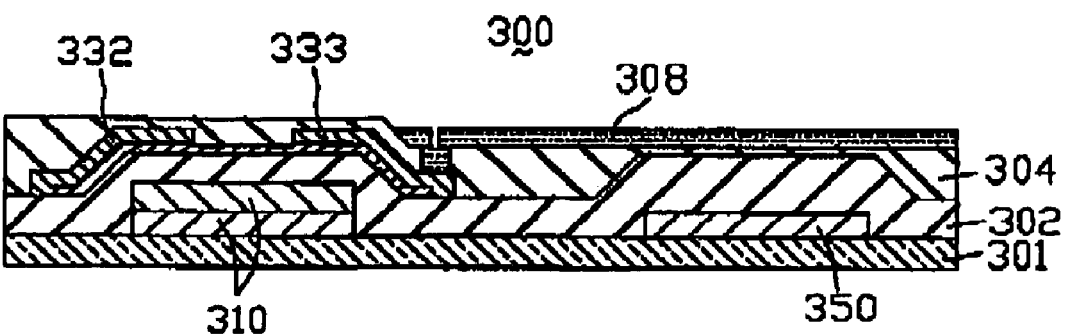
Figure 16:
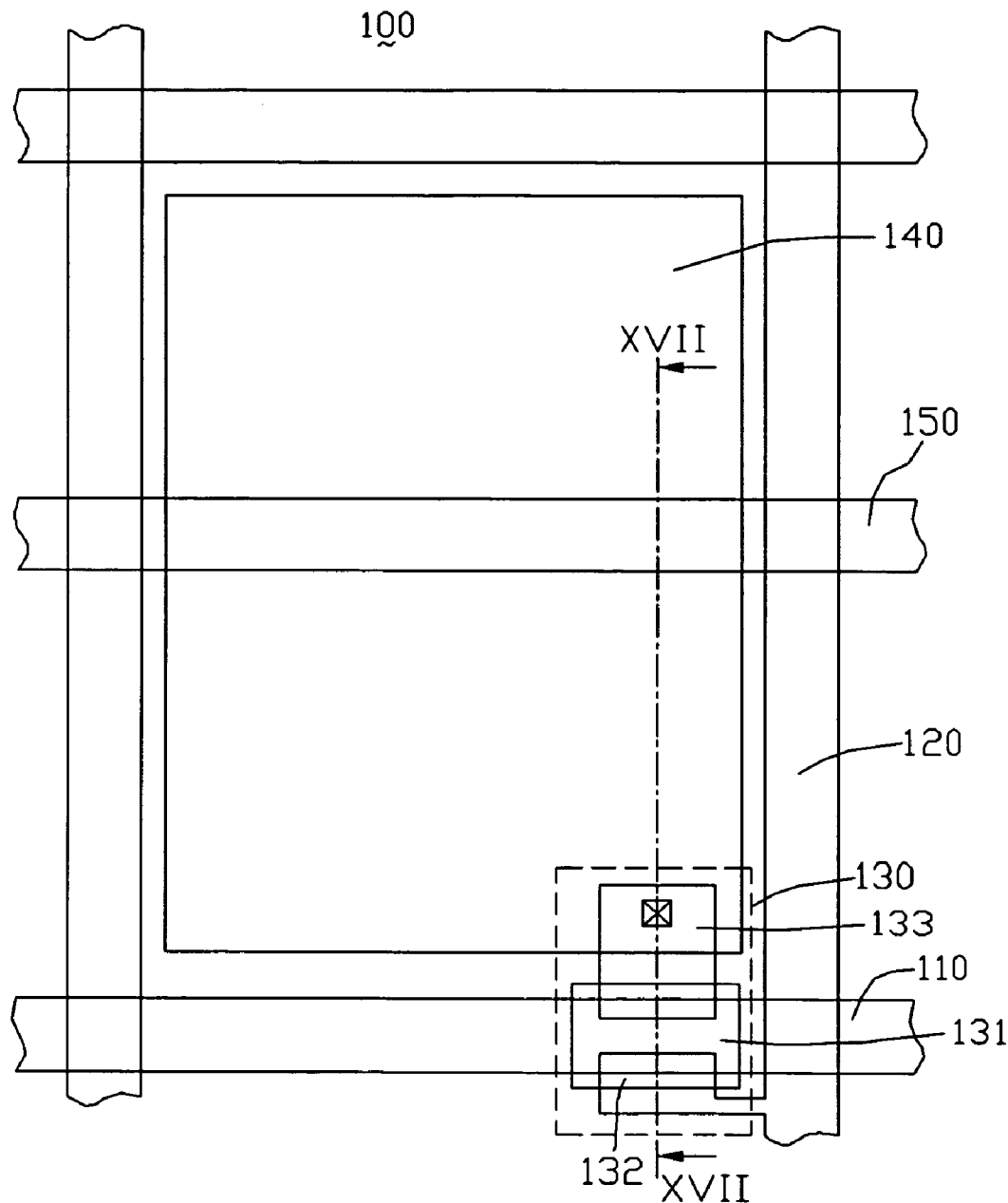
FIGS. 16 and 17 relate to structure of a conventional TFT array substrate. In the drawings, all the views are schematic.
Figure 17:
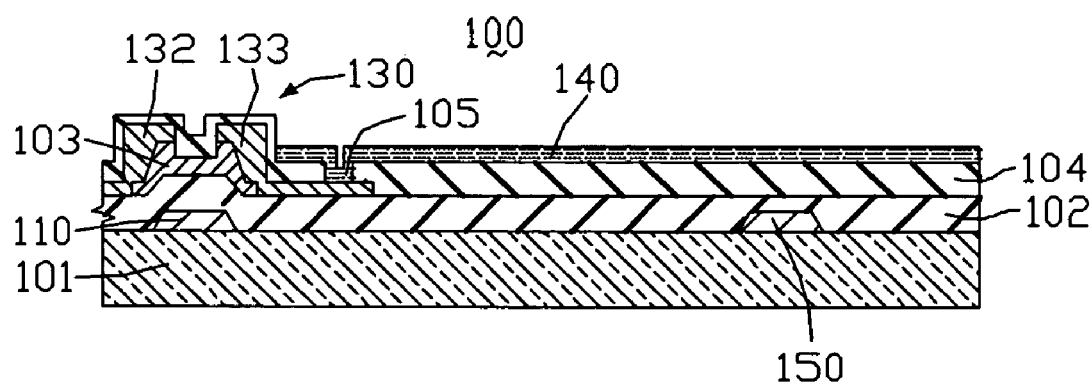

In a seventh step, referring to FIG. 14, a transparent conductive layer 306 and a fifth photo-resist layer 345 are sequentially formed on the passivation layer 304 including the connecting hole 305. The fifth photo-resist layer 345 is exposed by a fifth photo-mask, and then is developed, thereby forming a fifth photo-resist pattern (not shown). The transparent conductive layer 306 is etched according to the fifth photo-resist pattern, thereby forming a pattern of a pixel electrode 308. The fifth photo-resist pattern is then removed by an acetone solution. Thereby, the layered and patterned substrate 301 as shown in FIG. 15 is attained. The layered and patterned substrate 301 constitutes the TFT array substrate 300.

In summary, compared to the above-described conventional method, in the above-described exemplary method for fabricating the TFT array substrate 300, only one photo-mask process is used to form the gate electrode 310 and the reflective pattern 350, thus saving one photo-mask process. Therefore, a simplified method at a reduced cost is attained.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for fabricating a thin film transistor (TFT) array substrate, the method comprising:
   providing an insulating substrate;
   forming a gate electrode and a reflective pattern on the insulating substrate using a first photo-mask process;
   forming a gate insulating layer, an amorphous silicon and doped amorphous silicon layer, and a source/drain metal layer on the insulating substrate having the gate electrode and the reflective pattern;
   forming a source electrode and a drain electrode on the amorphous silicon and doped amorphous silicon layer;
   depositing a passivation layer on the source electrode, the drain electrode and the gate insulating layer; and
   forming a pixel electrode on the passivation layer, the pixel electrode completely covering the reflective pattern.

2. The method as claimed in claim 1, wherein the photo-mask process for forming the gate electrode and the reflective pattern comprises coating a photo-resist layer on the insulating substrate, exposing the photo-resist layer using a slit photo-mask, and developing the exposed photo-resist layer to form a photo-resist pattern.

3. The method as claimed in claim 2, wherein the slit photo-mask comprises a plurality of shielding regions and a plurality of slit regions, the shielding regions corresponding to the gate electrode, and the slit regions corresponding to the reflective pattern.

4. The method as claimed in claim 1, wherein the gate electrode comprises a first metal layer and a second metal layer.

5. The method as claimed in claim 4, wherein the first metal layer is made from a material having high reflectivity.

6. The method as claimed in claim 5, wherein the first metal layer is made from aluminum (Al), or an alloy of aluminum and neodymium (Nd).

7. The method as claimed in claim 5, wherein the reflective pattern is made of a same material as that of the first metal layer.

8. The method as claimed in claim 4, wherein the second metal layer is wade from material including any one or more items selected from the group consisting of molybdenum (Mo), chromium (Cr), and titanium (Ti).

* * * * *